United States Patent
Chu et al.

(10) Patent No.: US 7,593,273 B2
(45) Date of Patent: Sep. 22, 2009

(54) READ-LEVELING IMPLEMENTATIONS FOR DDR3 APPLICATIONS ON AN FPGA

(75) Inventors: Michael H. M. Chu, Fremont, CA (US);
Joseph Huang, Morgan Hill, CA (US);
Chiakang Sung, Milpitas, CA (US);
Yan Chong, San Jose, CA (US);
Andrew Bellis, Guildford (GB); Philip Clarke, Leatherhead (GB); Manoj B. Roge, San Jose, CA (US)

(73) Assignee: Altera Corporation, San Jose, CA (US)

( * ) Notice: Subject to any disclaimer, the term of this patent is extended or adjusted under 35 U.S.C. 154(b) by 83 days.

(21) Appl. No.: 11/935,310

(22) Filed: Nov. 5, 2007

(65) Prior Publication Data

US 2008/0291758 A1  Nov. 27, 2008

Related U.S. Application Data

(60) Provisional application No. 60/857,249, filed on Nov. 6, 2006.

(51) Int. Cl.
*G11C 7/10* (2006.01)
(52) U.S. Cl. ...................... 365/194; 365/193
(58) Field of Classification Search .................. 365/193
See application file for complete search history.

(56) References Cited

U.S. PATENT DOCUMENTS

| | | | |
|---|---|---|---|
| 6,484,268 B2 | 11/2002 | Tamura et al. | |
| 6,707,723 B2 * | 3/2004 | Jeong | 365/189.05 |
| 6,906,968 B2 * | 6/2005 | Kim et al. | 365/194 |
| 7,050,352 B2 * | 5/2006 | Cha | 365/189.16 |
| 7,123,051 B1 | 10/2006 | Lee et al. | |
| 7,463,534 B2 * | 12/2008 | Ku et al. | 365/189.011 |
| 2002/0075845 A1 | 6/2002 | Mullaney et al. | |
| 2007/0201286 A1 * | 8/2007 | Oh | 365/193 |

* cited by examiner

*Primary Examiner*—Tan T. Nguyen
(74) *Attorney, Agent, or Firm*—Townsend and Townsend and Crew LLP

(57) ABSTRACT

Circuits, methods, and apparatus for transferring data from a device's input clock domain to a core clock domain. One example achieves this by using a retiming element between input and core circuits. The retiming element is calibrated by incrementally sweeping a delay and receiving data at each increment. Minimum and maximum delays where data is received without errors are averaged. This average can then be used to adjust the timing of a circuit element inserted in an input path between an input register clocked by an input strobe signal and an output register clocked by a core clock signal. In one example, an input signal may be delayed by an amount corresponding to the delay setting. In other examples, each input signal is registered using an intermediate register between the input register and the output register, where a clock signal is delayed by an amount corresponding to the delay setting.

22 Claims, 16 Drawing Sheets

READ-LEVELING IMPLEMENTATIONS FOR DDR3 APPLICATIONS ON AN FPGA

CROSS-REFERENCES TO RELATED APPLICATIONS

This application claims the benefit of U.S. provisional application No. 60/857,249, filed Nov. 6, 2006, which is incorporated by reference.

BACKGROUND

The amount of data transferred between devices in computer systems has been increasing at a tremendous pace that shows no signs of abating. In particular, the amount of data transferred between memory devices and other devices, such as devices implemented using field programmable gate arrays (FPGAs), has grown prodigiously. Unfortunately, the rate at which these devices can process data has increased faster than the memory device's capacity to provide it. For this reason, faster memory interface protocols are being developed.

One such faster protocol is the Double-Data Rate 3 (DDR3) interface standard. In this standard, several memory devices communicate with a memory interface circuit on an FPGA or other device. Each memory device communicates using a number of data or DQ signals and a strobe or DQS signal. While the FPGA receives data, the FPGA provides a system clock signal to the memory devices, each of which provide a DQS and a number of DQ signals to the memory interface circuit. The memory devices use the system clock to adjust the frequency of the DQS and DQ signals. However, the system clock is routed to the memory devices using a fly-by topology. Accordingly, the DQ and DQS signals are provided asynchronously to the memory interface, that is, each memory device may provide DQS and DQ signals having any phase relationship to the system clock.

The DQ signals received by the memory interface are retimed using a phase-shifted version of the corresponding DQS signals. These retimed signals need to be retimed once again to an internal clock, which may be the system clock or a second clock signal, to transfer the signals to the core of the device. Unfortunately, if the timing between the phase-shifted DQS signal and the system clock is not optimal, data recovery errors may result. Conventional techniques have included using first-in-first-out memories, but these are comparatively large, complex circuits.

Thus, what is needed are circuits, methods, and apparatus that provide for the efficient transfer of data from a device's inputs to its core circuitry.

SUMMARY

Accordingly, embodiments of the present invention provide circuits, methods, and apparatus that provide for the transfer of data from an input clock domain to a device's core clock domain. An exemplary embodiment of the present invention achieves this by using a leveling element between a device's input and core circuits. One embodiment calibrates the leveling element by incrementally sweeping a delay and receiving data at each increment. Minimum and maximum delays where data is received without errors are recorded and averaged to generate a delay setting. This delay can then be used to adjust the leveling element inserted in an input path between an input register that is clocked by an input strobe signal and an output register that is clocked by a core clock signal. In various embodiments of the present invention, the delay may be used directly, that is, an input signal may be delayed by an amount corresponding to the delay setting. In other embodiments of the present invention, the leveling element is an intermediate register placed between the input register and the output register, where each input signal is retimed using an intermediate register, and where a clock signal for the intermediate register is delayed by an amount corresponding to the delay setting. In one such embodiment of the present invention, a number of clocks are provided to the intermediate registers, each to one group of data inputs, where the delay or phase of each clock signal is independently adjusted. In another embodiment of the present invention, a number of clocks are provided to each group of data inputs, where one of the number of clocks is selected and used to clock the intermediate registers in the group. In other embodiments of the present invention, other circuits, such as latches, may be used as the leveling element.

Another exemplary embodiment of the present invention provides a memory interface circuit that interfaces with a plurality of memory devices arranged, for example, on a dual inline memory module (DIMM). Each memory device communicates with the memory interface circuit using a strobe signal, referred to as a DQS signal, and several data lines, which are referred to as DQ signals. The memory interface provides a system clock to each of the memory devices. The memory devices use the system clock such that the DQS and DQ signals have the correct fundamental frequency and the strobe and data signals provided by each memory device are aligned with each other. However, newer memory interface standards, such as DDR3 route the system clock using a fly-by topology. This topology results in the reception of the system clock by the memory devices at different times. Accordingly, the memory devices each provide DQ and DQS signals at times that are skewed relative to each other. As a result, the received DQS strobe signals are out of phase with the system clock.

The memory interface receives data signals from the memory devices and retimes them using an input register clocked by a corresponding strobe signal. However, since the strobe signal is out of phase with the system clock in the memory controller, the input data signals are re-registered using an output register clocked by the system clock, or a second clock derived from the system clock for use by core circuitry connected to the memory interface. Unfortunately, if the strobe signal is improperly aligned with the system clock, data may not transfer from the input register to the output register properly, and errors in data reception may occur.

Accordingly, a specific embodiment of the present invention provides leveling elements implemented as delay elements between the input and output registers such that data is properly transferred to the core circuitry. To calibrate the delay elements, the delay provided by the delay element is incremented over a range of values. In this specific embodiment, the range of values is approximately covers one clock cycle period, though in other embodiments, the range of values may be greater or less than one clock cycle. At each increment, a known data pattern is provided by each memory device to the memory interface. The received data is checked for errors for each DQ signal in a group. Minimum and maximum delays where error-free reception occurs for the DQ signals in the group are noted. These delays may be averaged and the average delay used to delay the input signal. Each DQ/DQS group typically is delayed an independently determined delay, though each DQ signal in the group is typically delayed the same amount. In other embodiments, each DQ in a DQ/DQS group may be delayed an independent amount.

Another embodiment of the present invention provides leveling elements implemented as an intermediate register between the input and output registers. The intermediate register is clocked by a delayed version of the system clock, where the delay is calibrated for error-free data reception. In this embodiment, a phase-locked loop (PLL) generates the system clock and several delayed versions of the system clock. Each of the delayed versions of the system clock is provided to the intermediate registers for one group of DQ inputs. Again, the delays of these versions of the system clock are incrementally increased (or decreased) and a known data pattern is received at each increment. For each DQ group, minimum and maximum delays where error-free reception occurs for the DQ signals in the group are averaged and a clock delayed by this amount provided to intermediate registers for the DQ group. Typically, one clock line having one delay is used for each intermediate register in a DQ group, while each DQ group has a different delayed clock that has an independently calibrated delay.

Another embodiment of the present invention also provides leveling elements implemented as intermediate registers between the input and output registers. These intermediate registers are clocked by a delayed version of the system clock, where the delay is calibrated for error-free data reception. In this embodiment, a number of delay elements are used to generate a number of delayed clocks, which are in turn multiplexed using a clock multiplexer. Specifically, one clock, such as the synchronization clock that clocks the output synchronization registers or a second clock derived from the system clock, is received by the number of delay elements that generate a number of delayed clock signals. The delayed clock signals are routed to each DQ group. A clock multiplexer is associated with each DQ group, where the clock multiplexer selects one of the delayed clock signals and provides it to the intermediate registers in the DQ group. During calibration, the clock multiplexer incrementally adjusts the delay of its output clock signal by selecting different input clock signals. Again, a known data pattern is received at each increment. For each DQ group, minimum and maximum delays where error-free reception occurs for the DQ signals in the group are averaged and a clock delayed by this amount is selected by the clock multiplexer and provided to intermediate registers for the DQ group. Typically, the selected multiplexer input is chosen independently for each DQ group.

Various embodiments of the present invention may incorporate one or more of these or the other features described herein. A better understanding of the nature and advantages of the present invention may be gained with reference to the following detailed description and the accompanying drawings.

DESCRIPTION OF EXEMPLARY EMBODIMENTS

Figure 1:
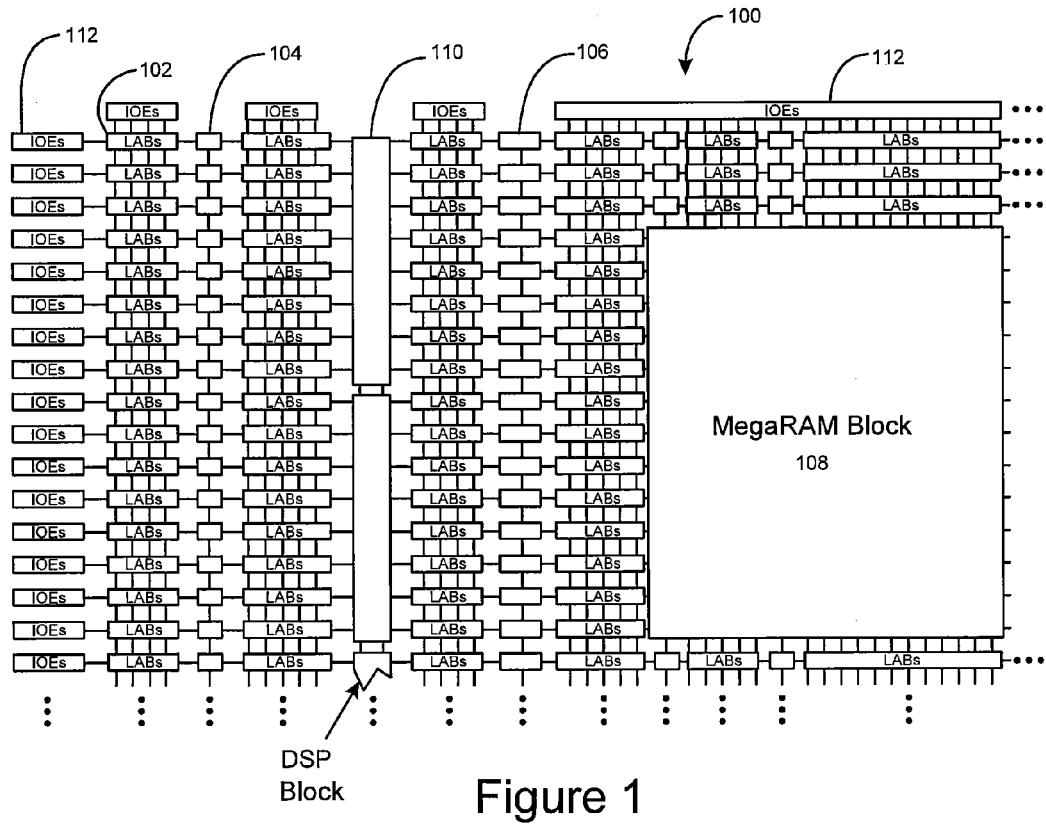
FIG. 1 is a simplified block diagram of a programmable logic device that is improved by incorporating embodiments of the present invention.

FIG. 1 is a simplified partial block diagram of an exemplary high-density programmable logic device or FPGA 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4 K blocks 106, and an M-Block 108 providing 512 bits of RAM. These memory blocks may also include shift registers and FIFO buffers. PLD 100 further includes digital signal processing (DSP) blocks 110 that can implement, for example, multipliers with addition or subtraction features.

It is to be understood that PLD 100 is described herein for illustrative purposes only and that the present invention can be implemented in many different types of PLDs, FPGAs, and the other types of digital integrated circuits.

While PLDs or FPGAs of the type shown in FIG. 1 provide many of the resources required to implement system level solutions, the present invention can also benefit systems wherein a PLD is one of several components.

Figure 2:
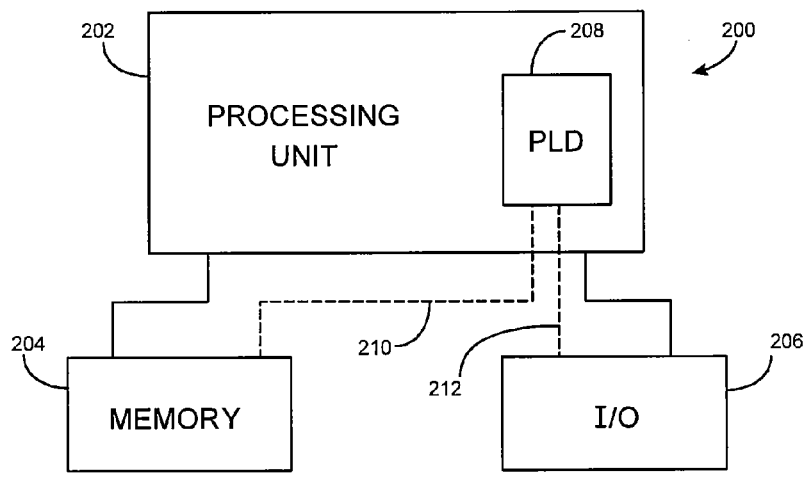
FIG. 2 is a block diagram of an electronic system that is improved by incorporating embodiments of the present invention.

FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications, such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an input/output unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to input/output unit 206 through connection 212.

Processing unit 202 may direct data to an appropriate system component for processing or storage, execute a program stored in memory 204, or receive and transmit data via input/output unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC card flash disk memory, tape, or any other storage means, or any combination of these storage means.

Figure 3:
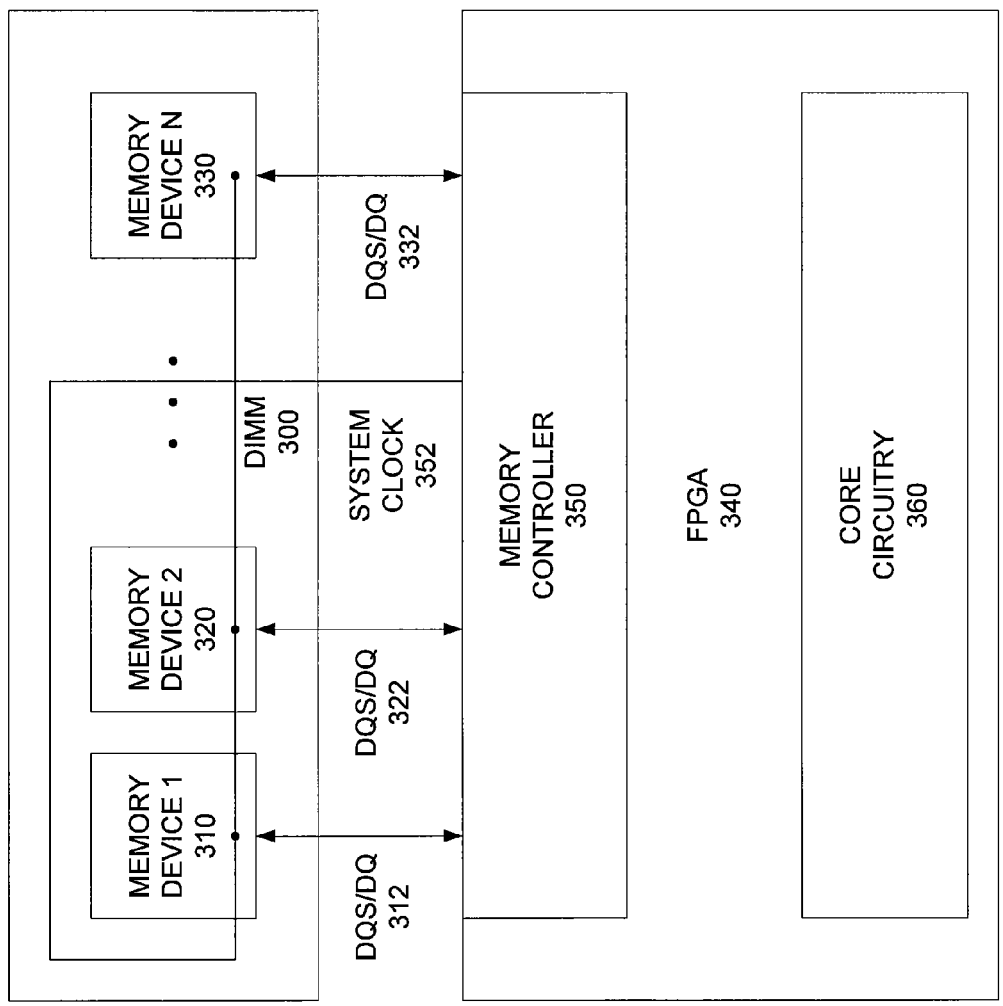
FIG. 3 is a block diagram of a memory interface that is improved by the incorporation of embodiments of the present invention.

FIG. 3 is a block diagram of a memory interface that is improved by the incorporation of embodiments of the present invention. This figure includes a number of memories, in this example arranged in a dual in-line memory module (DIMM) 300, and an integrated circuit, in this example an FPGA 340. The DIMM 300 includes a number of memory devices 310, 320, through 330. The FPGA 340 includes a memory controller 350 and core circuitry 360. The memory controller 350 reads and writes data using a number of DQS/DQ groups 312, 322, and 332, and receives data from and provides data to the core circuits 360. Timing for the DQS and DQ signals is derived from a system clock 352, which is provided from the memory controller 350 to the memory devices 310, 320, and 330.

In DDR3 systems, the system clock 352 is routed using a fly-by topology. That is, the memory devices 310 through 330 receive the system clock 352 in a serial fashion. Other signals, such as control signals (not shown) may also be routed this way. This topology provides a greater signal integrity as compared to more conventional routing. The result of using this topology is that memory device 310 receives the system clock 352 first, and the other memory devices receive the system clock some time later, with memory device 330 receiving it last. The skew between the arrival of the system clock 352 at the memory devices can be on the order of a clock cycle. Since the timing for the DQ and DQS signals provided by the memory devices is based on the system clock 352, the DQ and DQS signals received by the memory controller 350 may also be skewed by as much as a clock cycle.

Accordingly, the DDQS and DQ signal groups from the memory devices each operate at the same frequency but have phase relationships that are uncorrelated to each other. Without more, these phase shifts may lead to errors in the reception of data by the memory controller 350 due to timing errors that occur during the transfer of data from the capture registers to the synchronization registers, as shown below. Accordingly, embodiments of the present invention provide circuits, methods, and apparatus that provide for consistent and accurate data reception by memory controllers, such as the memory controller 350.

Figure 4:
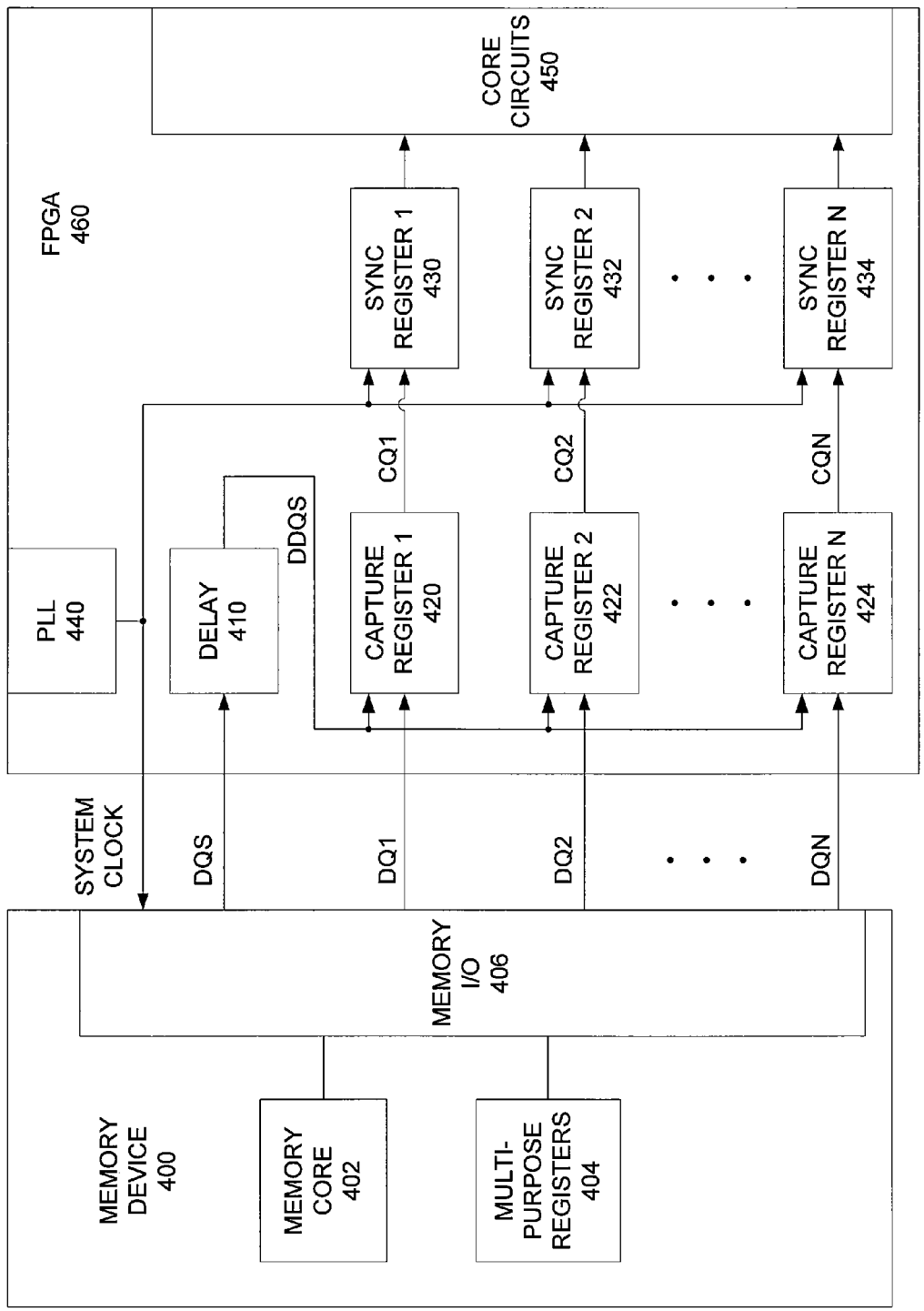
FIG. 4 is a block diagram illustrating a portion of the memory interface of FIG. 3 in greater detail.

FIG. 4 is a block diagram illustrating a portion of the memory interface of FIG. 3 in greater detail. This figure includes a memory device 400 that further includes a memory core 402, multipurpose registers 404, and a memory input and output interface 406, as well as an integrated circuit 460, such as an FPGA, which includes a delay element 410, capture registers 420 through 424, synchronizing registers 430 through 434, phase-locked loop 440, and core circuits 450.

In this example embodiment, a phase-locked loop 440 provides a system clock to the memory device 400. The memory device in turn provides a data strobe DQS signal and data signals DQ1, DQ2, and DQN. The data strobe signal is phase shifted by delay circuit 410 to produce a delayed DQS signal, DDQS. The delayed strobe signaled DDQS clocks capture registers 420, 422, and 424, which capture input data signals DQ1, DQ2, and DQN, respectively. The outputs of the capture registers are provided to synchronization registers 430, 432, and 434, which are clocked by the system clock. The outputs the synchronization registers are provided to core circuits 450.

In a typical system, the data strobe signal DQS is aligned with the data signals DQ1, DQ2, and DQN when provided by the memory interface 406. Once received by the FPGA 460, the DQS signal is delayed, typically by approximately 90 degrees (though other phase shifts may be required), so that the edges of the delayed DQS signal DDQS are centered to the bits of the incoming DQ data. This enables the capture registers to clock the incoming DQ data.

Again, the DQS signal may have any phase relationship with the system clock. Thus, the DDQS signal may also have any possible phase relationship with the system clock. This means that as data is passed from a capture register to a synchronization register, metastates or other instabilities may occur. This is shown further in the following figures.

Figure 5:
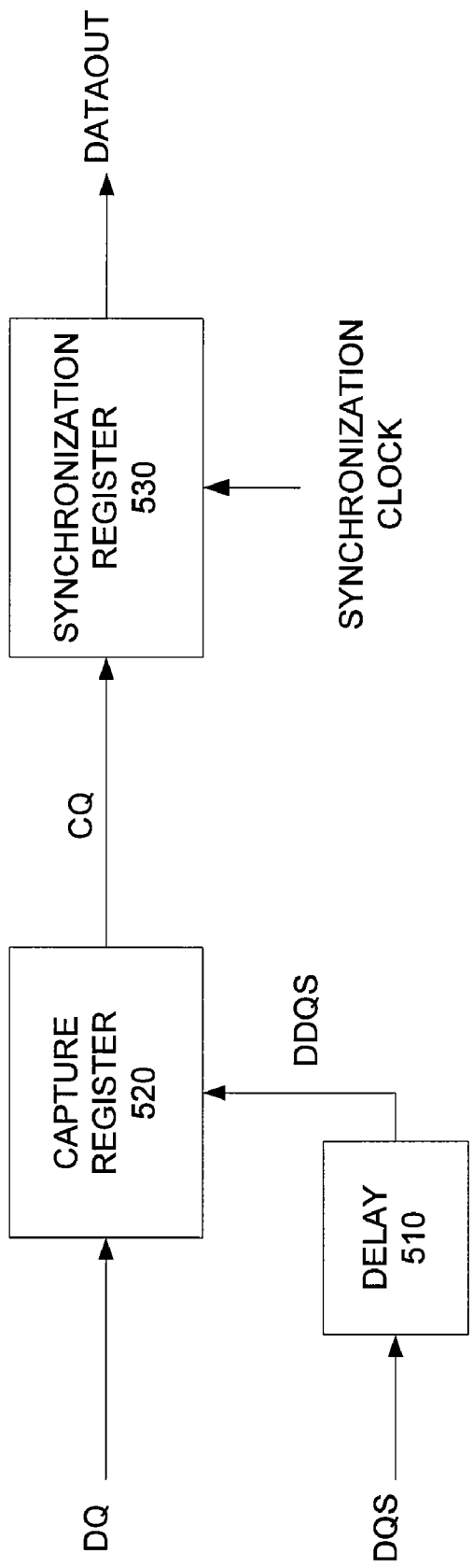
FIG. 5 is a simplified block diagram of a portion of an input path of a memory interface that is improved by the incorporation of an embodiment of the present invention.

FIG. 5 is a simplified block diagram of a portion of an input path of a memory interface that is improved by the incorporation of an embodiment of the present invention. This figure includes a delay element 510, capture register 520, and synchronization register 530. Data is received on the DQ line by capture register 520. The DQS signal is received from the memory devices and delayed or phase shifted by delay circuit 510 to generate a delayed DQS signal DDQS. The DDQS signal clocks the capture register, which provides a retimed data output CQ to the synchronization register 530. The synchronization register 530 is clocked by the synchronization clock, and provides an output DATAOUT to core or other circuits.

If data transitions of the signal CQ occur near active edges of the system clock, metastates or other instabilities in the synchronization register may occur, leading to errors in the received data at DATAOUT. In the following examples, the active edges of the synchronization register 530 are shown as rising edges, though in other embodiments of the present invention, the active edges of the synchronization register 530 may be falling edges.

Figure 6:
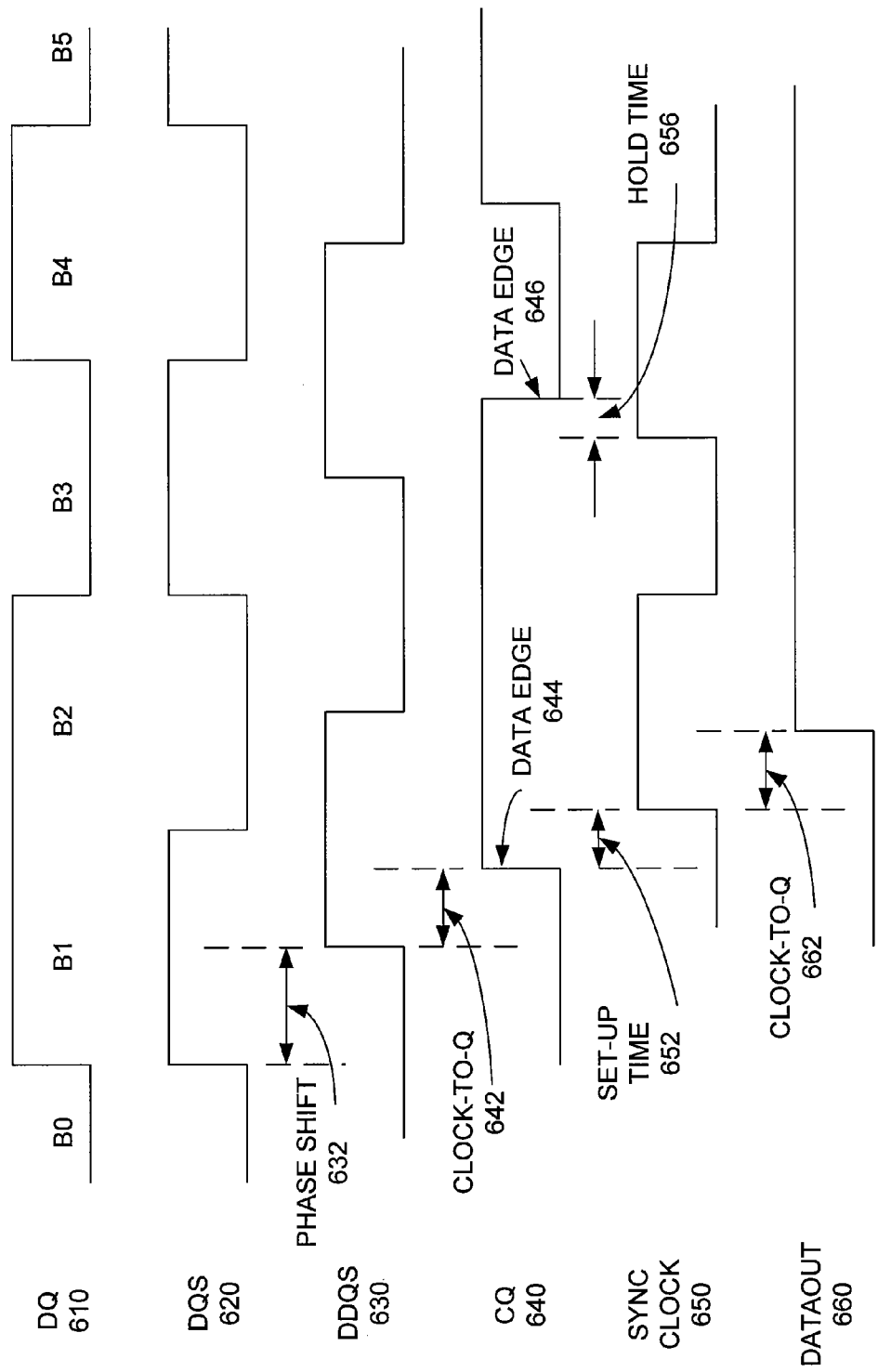
FIG. 6 illustrates a possible timing for the circuitry of FIG. 5 that may lead to metastates and other instabilities during data reception.

FIG. 6 illustrates a possible timing for the circuitry of FIG. 5 that may lead to metastates and other instabilities during data reception. These metastates or other instabilities typically lead to errors in data reception. In this example, the timing diagram illustrates timing for a data signal DQ 610, data strobe signal DQS 620, delayed DQS signal DDQS 630, retimed data signal CQ 640, synchronization clock SYNC CLOCK 650, and data output signal DATAOUT 660.

Signals DQ 610 and DQS 620 are received from a memory device by an integrated circuit, such as an FPGA. The data strobe signal DQS 620 is phase shifted an amount 632 to generate DDQS 630. DDQS 630 clocks the DQ 610 signal to generate CQ 640. Edges of CQ 640 follow DQS rising edges by a clock-to-Q delay 642. Again, the SYNC CLOCK 650 may have any timing relationship to DDQS 630. If rising edges of the SYNC CLOCK 650 approach the data edges 644 by an amount less than the setup time 652, metastates or data instabilities may occur. Similarly, if rising edges of SYNC CLOCK 650 are near data edge 646, hold time 656 may be violated. If one of these conditions occurs, that is, the setup time 652 or the hold time 656 are violated, instabilities in the output signal DATAOUT 660 may occur. Accordingly, embodiments of the present invention provide leveling elements such that the signal CQ 640 maintains a relationship with the SYNC CLOCK 650 such that these registers do not become metastable and that instabilities do not occur. Examples are shown in the following figures.

Figure 7:
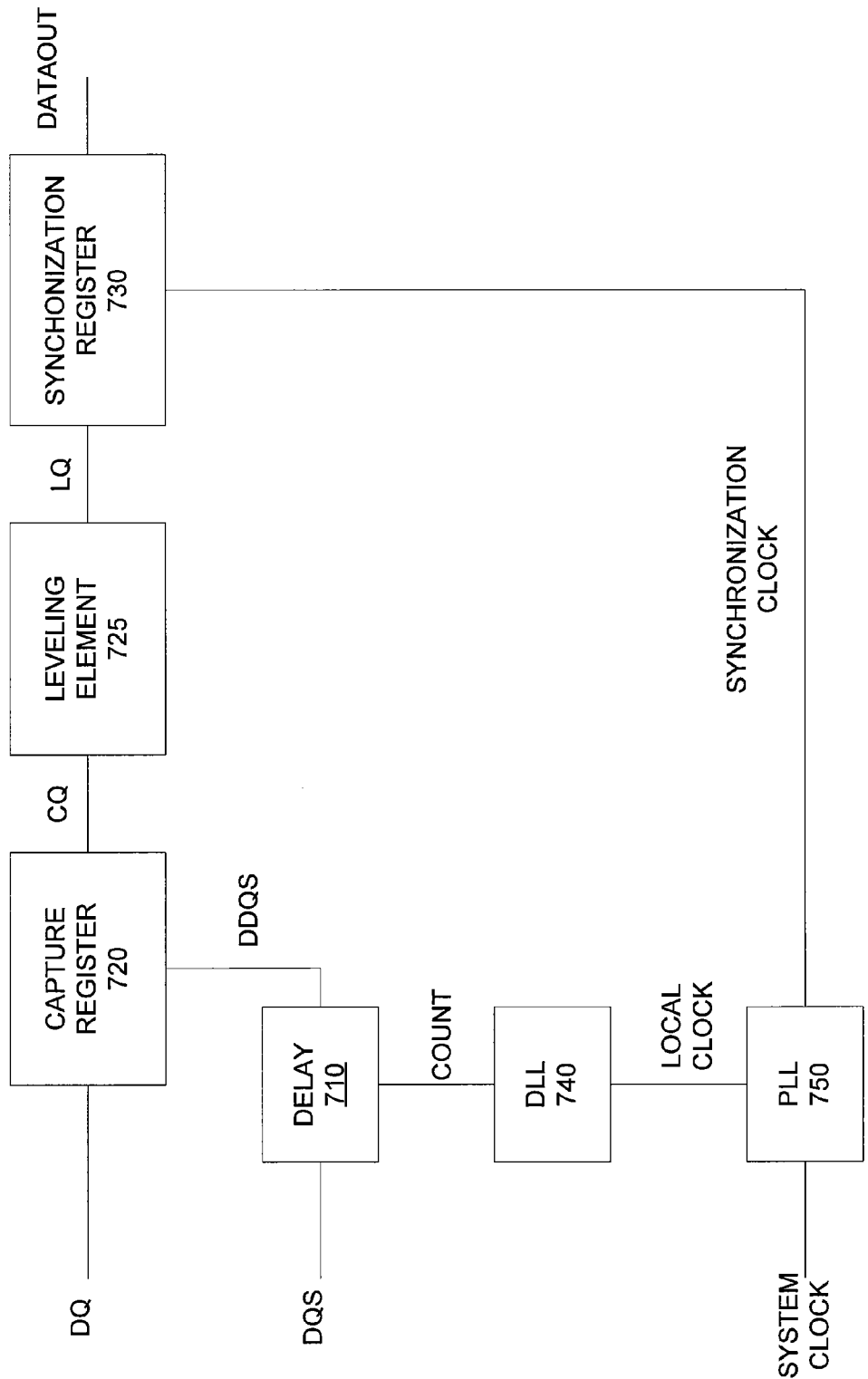
FIG. 7 is a block diagram illustrating a portion of a memory interface circuit that includes a leveling element consistent with an embodiment of the present invention.

FIG. 7 is a block diagram illustrating a portion of a memory interface circuit that includes a leveling element consistent with an embodiment of the present invention. This figure includes a capture register 720, leveling element 725, synchronization register 730, delay 710, delay-locked loop 740, and phase-locked loop 750. Data signal DQ is received by the capture register 720. A data strobe signal DQS is received by the delay 710 and phase shifted to generate a delayed DQS signal DDQS that clocks the capture registers 720. The output of the capture registers 720 is received by the leveling element 725, which in turn provides an output to the synchronization register 730. The synchronization register 730 is clocked by a synchronization clock provided by phase-locked loop 750. The synchronization register 730 provides an output DATAOUT to other circuitry (not shown), for example core circuitry of an FPGA. The delay-locked loop 740 synchronizes to a local clock generated by phase-locked loop 750 and provides a control signal COUNT to delay 710, such that the DDQS signal is properly phase shifted to clock the incoming data DQ.

Without the presence of the leveling element 725, the data CQ provided by the capture register 720 may be provided to the synchronization register 730 near an active edge of the synchronization clock. Under such a condition, the synchronization register may become unstable and provide incorrect data on the DATAOUT line. Accordingly, the leveling element 725 retimes the output CQ from the capture register 720 as signal LQ, which has a more desirable timing relationship with the synchronization clock. In various embodiments of the present invention, the leveling element 725 may include various circuits. In a specific embodiment of the present invention, the leveling element is a delay line whose delay is varied to avoid meta-stabilities in the synchronization registers 730. In other embodiments of the present invention, the leveling element 720 includes a register timed by a clock whose phase can be varied. In still other embodiments of the present invention, other circuits, such as a latch, may be used. A timing diagram illustrating the timing of the circuitry of FIG. 7 is shown in the following figure.

Figure 8:
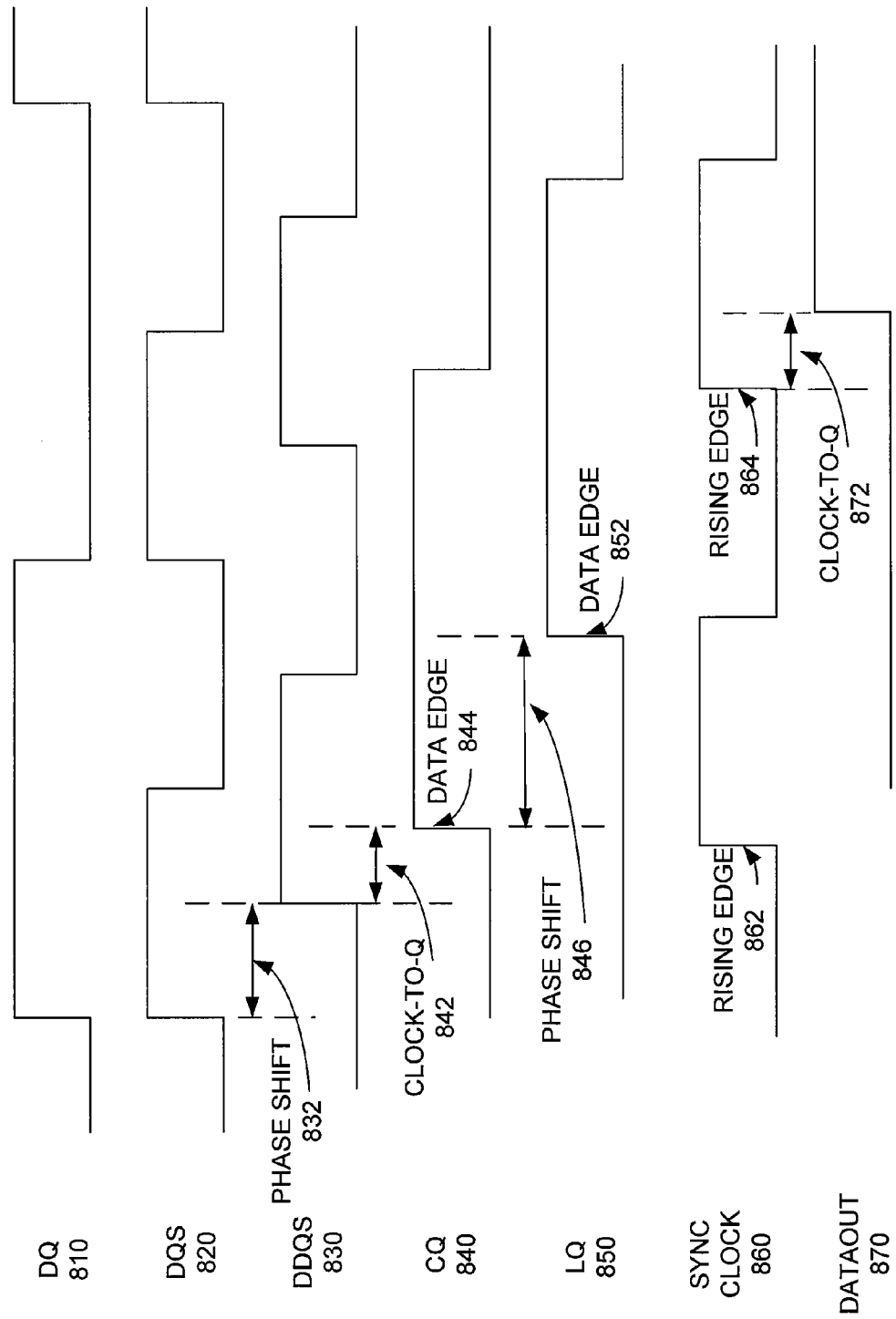
FIG. 8 illustrates the timing of the circuitry shown in FIG. 7.

FIG. 8 illustrates the timing of the circuitry shown in FIG. 7. This figure includes timing for signals DQ 810, DQS 820, DDQS 830, CQ 840, LQ 850, synchronization (SYNC) CLOCK 860, and DATAOUT 870. The data strobe signal DQS 820 is phase shifted an amount 832 to generate the DDQS signal 830. The DDQS signal is used to capture the data signal DQ. The output of the capture registers, CQ 840, follows the clock edges by a clock-to-Q delay 842. The leveling element 725 phase shifts the data signal CQ 840 an amount 846 to generate LQ 850, such that the data edge 852 of LQ 850 is away from the rising edges 862 and 864 of the SYNC CLOCK 860. The DATAOUT signal 870 changes state following a rising edge 864 of the SYNC CLOCK 860 by a clock-to-Q delay 872. Again, in various embodiments of the present invention, the leveling element may be implemented using various types of circuits. In a specific embodiment of present invention, the leveling element 725 is a delay line. An example is shown in the following figure.

Figure 9:
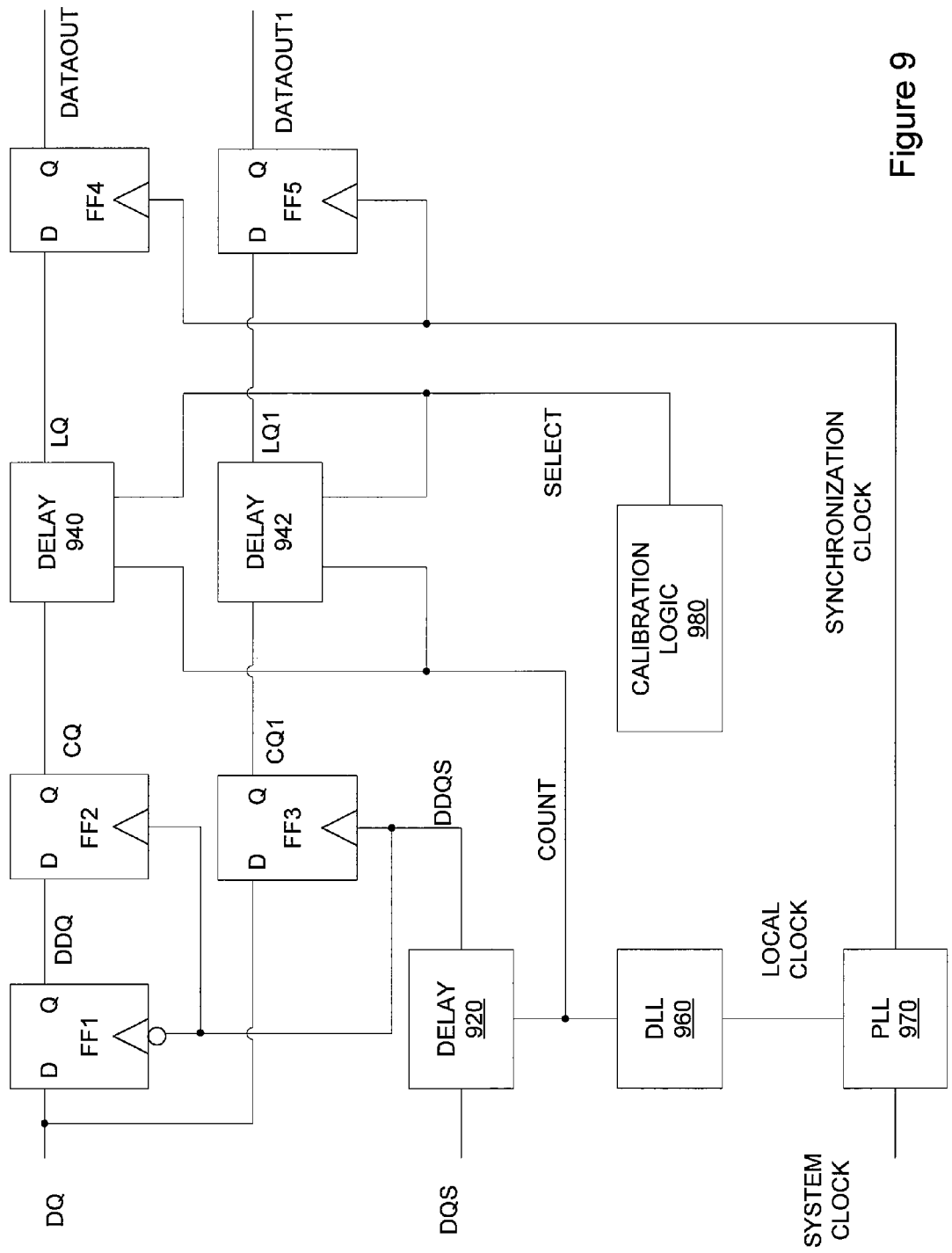
FIG. 9 is a block diagram of a portion of a memory interface where a leveling element is implemented as a delay line according to an embodiment of the present invention.

FIG. 9 is a block diagram of a portion of a memory interface where a leveling element is implemented as a delay line according to an embodiment of the present invention. This figure includes a capture register, which is implemented as flip-flops FF1, FF2, and FF3, leveling elements, implemented here as delays 940 and 942, and synchronization register flip-flops FF4 and FF5. Also included are delay 920, a delay-locked loop 960, phase-locked loop 970, and calibration logic 980.

Data DQ is received by capture register flip-flops FF1 and FF3 on alternating edges of the DDQS signal. The output of FF1 is retimed by flip-flop FF2, such that the data outputs CQ and CQ1 are provided by the capture register on rising edges of DDQS. The data strobe signal DQS is delayed to generate the DDQS signal. The outputs of the capture register CQ and CQ1 are delayed by delay elements 940 and 942 to generate signals LQ and LQ1. Signals LQ and LQ1 are retimed by resynchronization registers FF4 and FF5, which provide data outputs DATAOUT and DATAOUT1. The delays provided by delay lines 940 and 942 are adjusted such that instabilities are avoided at resynchronization registers FF4 and FF5.

A system clock is received from a crystal oscillator or other period source by phase-locked loop 970, which in turn generates a local clock and a synchronizing clock. The synchronization clock is tracked by the delay-locked loop 960, which provides a control signal COUNT to the delays 920, 940, 942. This sets the delay through individual delay elements in the delay lines. In this way, as temperature, processing, and voltage vary, the value of the COUNT can be adjusted, thereby keeping the delays at least relatively constant.

Accordingly, the COUNT signal is incremented or decremented with changing temperature, voltage, and processing, such that the delays through the delays 940 and 942 remain fairly constant. Again, if data edges of the LQ and LQ1 signals are near active edges of the synchronizing clock, there may be metastable conditions in the synchronizing registers. Accordingly, the delays of delay elements 940 and 942 are adjusted to avoid these conditions. Specifically, the delays through delay 940 and delay 942 are adjusted by one or more SELECT signals provided by the calibration logic 980. In this way, the delays provided by the delays 940 and 942 are controlled by the COUNT signal, which adjusts to compensate for temperate and voltage supply changes, and the SELECT signal, which adjusts the delay so data is properly transferred. An example of a delay element that is adjusted in this way is shown the following figure.

Figure 10:
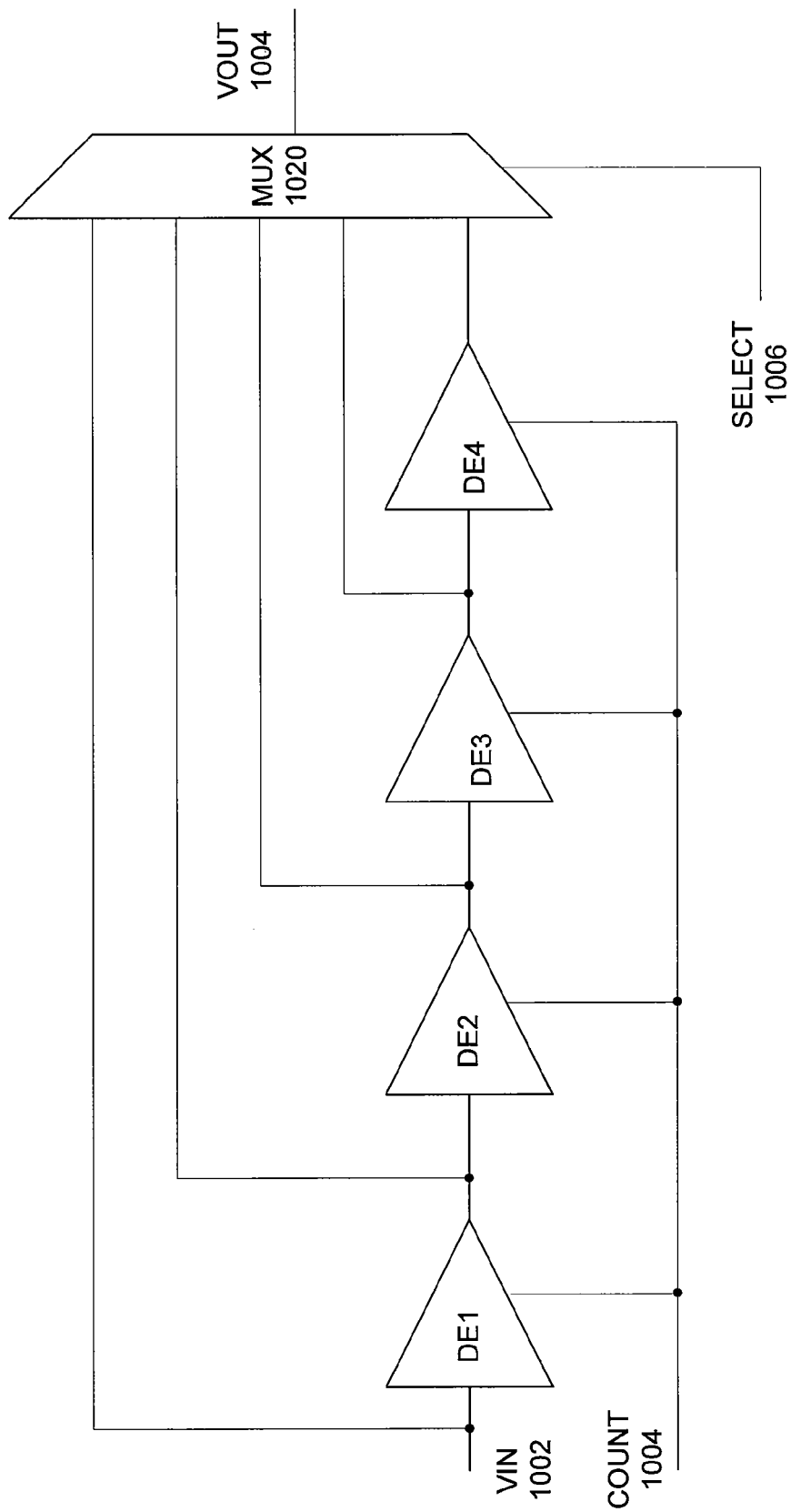
FIG. 10 illustrates a delay line that may be used as the delay lines 940 and 942 in FIG. 9 or other embodiments of the present invention.

FIG. 10 illustrates a delay line that may be used as the delay lines 940 and 942 in FIG. 9, or as delay lines in other embodiments of the present invention. This figure includes a number of delay elements DE1, DE2, DE3, and DE4, the outputs of which are selected by a multiplexer 1020 under the control of one or more select signals provided by a calibration logic circuit. In other embodiments of the present invention, other numbers of delay elements may be used. For example, where finer resolution is needed, more delay elements can used. A delay line having "N" elements will provide a resolution of 360/N.

Specifically, a control signal COUNT is provided on line 1004 to the delay elements DE1, DE2, DE3, and DE4. This controls the delay through each delay element, such that the delay provided by them has a reduced variability with temperature, processing, and voltage. Specifically, each delay element may be implemented as one or more individual delay circuits, where the delay is dependent on the value of the COUNT signal. For example, each delay element may be one or more circuits having a current discharging a voltage across a capacitor. Alternately, each delay element may include one or more a current starved inverters, where a current starved inverter is implemented as a current source that provides a variable current to an inverter stage. The value of the current can be dependent on the value of the COUNT signal, such that a lower COUNT value provides less current to the inverters, increasing the delay through the inverter. In other embodiments of the present invention, other types of delay elements may be implemented.

The signal selected by multiplexer 1020 is provided as a data signal to one of the synchronization registers. The select signal or signals 1006 are generated by a calibration logic circuit, such that metastates or instabilities in the synchronization registers are avoided. An example of how the calibration logic accomplishes this task is shown in the following figure.

Figure 11:
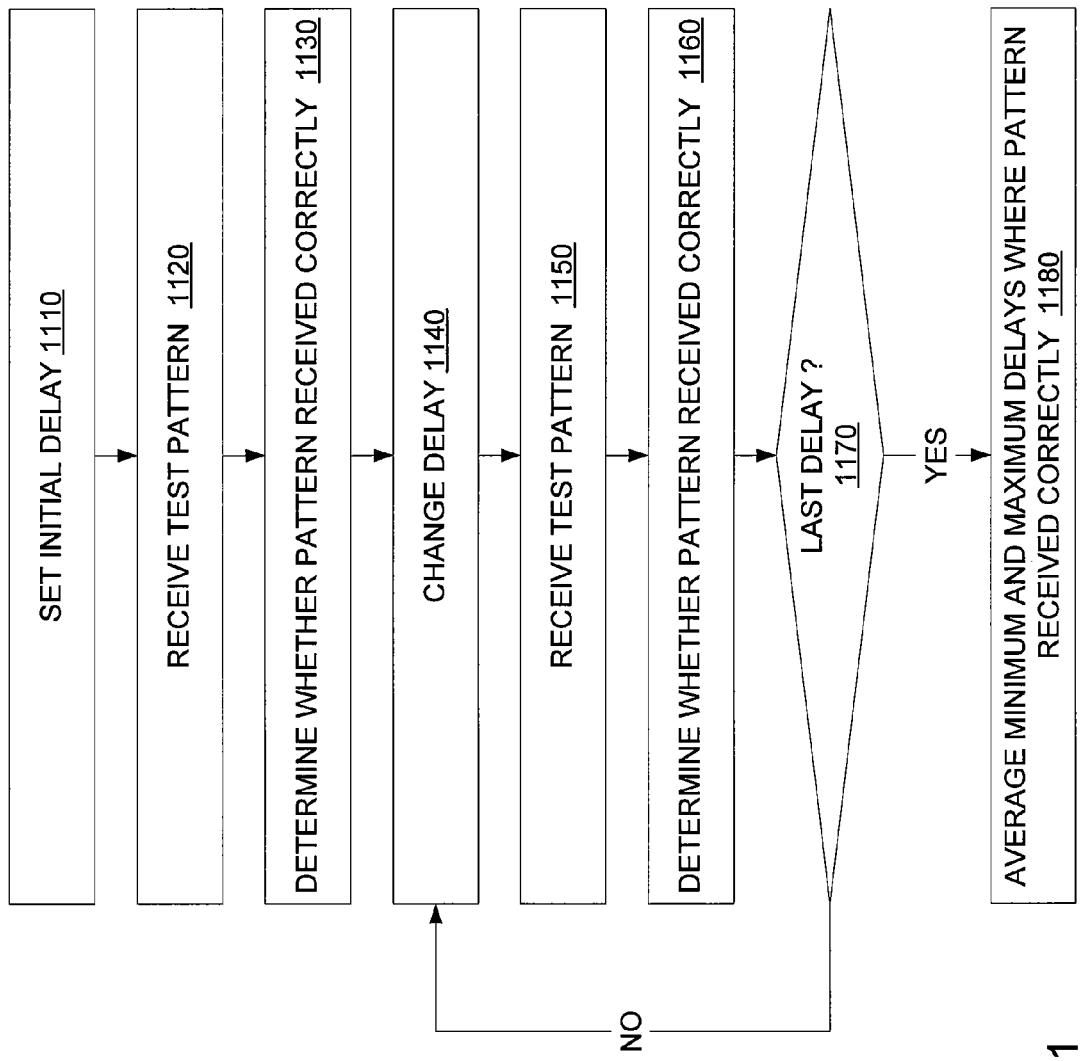
FIG. 11 is a flowchart illustrating the calibration routine for setting a delay through the delays 940 and 942 in FIG. 9.

FIG. 11 is a flowchart illustrating the calibration routine for setting a delay through the delays 940 and 942 in FIG. 9 or other delays in other embodiments of the present invention. In this method, data is received at a number of possible delay settings. The validity of the data reception at each delay setting is determined, and from this an optimal delay setting is found.

Specifically, in act 1110, an initial delay is set. In act 1120 a test pattern is received. In a typical embodiment of the present invention, this test pattern is received from onboard test registers located on the memory devices, for example, multipurpose registers 404.

In act 1130, it is determined whether the test pattern has been received correctly. In a typical embodiment of the present invention, data from only one side of each double-data-rate path is checked to determine whether data has been correctly received. For example, in FIG. 9, data at the DATAOUT output is checked, while data at the DATAOUT1 is redundant and is therefore not checked to speed up the calibration routine. In other embodiments of the present invention, only the DATAOUT1 output is checked, while in others, both outputs are checked. Further, in various embodiments of the present invention, data received by each DQ path in a DQ/DQS group is checked in determining whether data was correctly received, that is, data needs to be correctly received by each DQ path to be considered correctly received. In other embodiments, only one DQ path is checked, again to speed up the calibration routine. In other embodiments, these and other techniques may be mixed. For example, an initial calibration may be performed using each DQ path in a DQ/DQS group, while later adjustments are made using only one DQ path.

In act 1140, the delay is changed. For example, a new multiplexer input may be selected by multiplexer 1020 in FIG. 10. In act 1150, the test pattern is received again, while in act 1160, it is determined whether the pattern is received correctly. In act 1170, it is determined whether the last delay has been tested. If not, the delay is changed again in act 1140. If the last delay has been tested, the minimum and maximum delays where the pattern was received correctly are averaged in act 1180, and that delay is used as the delay for delay elements 940 and 942. In an embodiment of the present invention where the delay is incremented or decremented monotonically, the delay is set to the average of the first and last delays where the pattern was received correctly.

Figure 12:
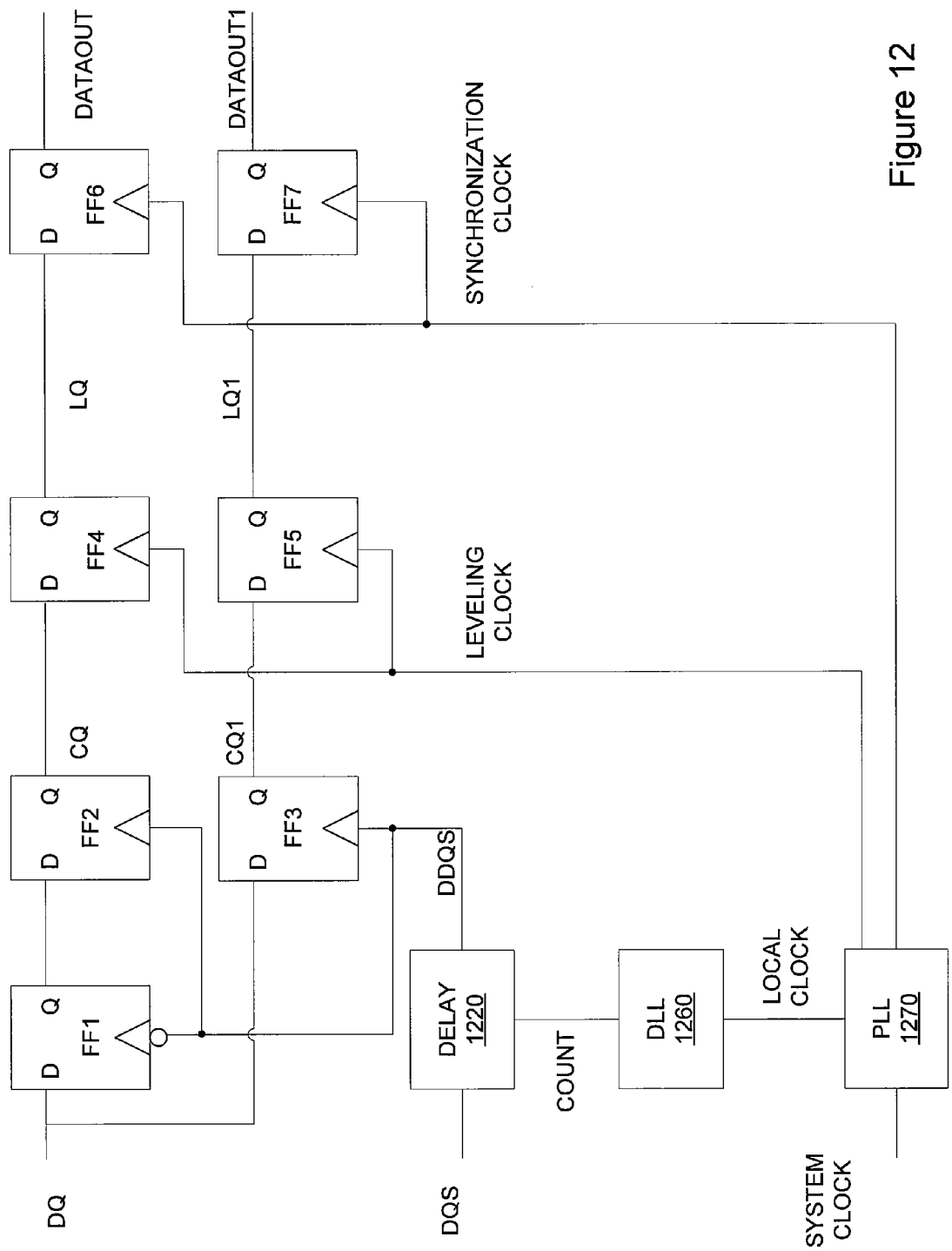
FIG. 12 is a block diagram of a portion of a memory interface consistent with an embodiment of the present invention where the leveling element is a register.

FIG. 12 is a block diagram of a portion of a memory interface consistent with an embodiment of the present invention. In this embodiment, the leveling element is a register. This figure includes a double-data-rate capture register that is implemented using flip-flops FF1, FF2, and FF3, leveling elements implemented using flip-flops FF4 and FF5, synchronization registers FF6 and FF7, delay element 1220, delay-locked loop 1260, and phase-locked loop 1270.

Data is received on the DQ line by flip-flops FF1 and FF3 on alternating edges of the delayed DQS signal DDQS. The outputs of the capture register are provided as CQ and CQ1 on rising edges of the DDQS signal to the leveling elements FF4 and FF5. The leveling elements retime the data and provide outputs LQ and LQ1 to synchronization registers FF6 and FF7. These registers then provide data outputs DATAOUT and DATAOUT1 to the core or other circuits.

A data strobe signal DQS is received by the delay element 1220, which phase shifts it to generate the delayed DQS signal, DDQS. A system clock, for example, generated by a crystal oscillator or other source, is received by the phase-locked loop 1270. The phase-locked loop 1270 generates a local clock for the delay-locked loop 1260, leveling clocks for the leveling elements FF4 and FF5, and a synchronization clock for the synchronization registers FF6 and FF7. The delay-locked loop 1260 synchronizes to the local clock and generates a digital control signal COUNT, which it provides to the delay element 1220.

In these circuits, data is transferred from capture register flip-flops FF2 and FF3 to leveling elements FF4 and FF5, and again from leveling elements FF4 and FF5 to synchronization registers FF6 and FF7. Accordingly, the leveling clock should be timed such that metastates and instability are avoided as leveling elements FF4 and FF5 receive data from the capture register flip-flops FF2 and FF3, and again as leveling elements FF4 and FF5 provide data to the synchronization registers FF6 and FF7. Accordingly, in this embodiment of the present invention, the delay of the leveling clock relative to the synchronization clock is adjusted by the phase-locked loop 1270, such that data is correctly received and provided to the core circuits.

In one embodiment of the present invention, phase-locked loop 1270 provides one leveling clock signal for each DQ/DQS group of signals received by the memory interface. In other embodiments of the present invention, other numbers of leveling clocks may be provided to other groups of signal paths. One method of adjusting a leveling clock timing is shown in the following figure.

Figure 13:
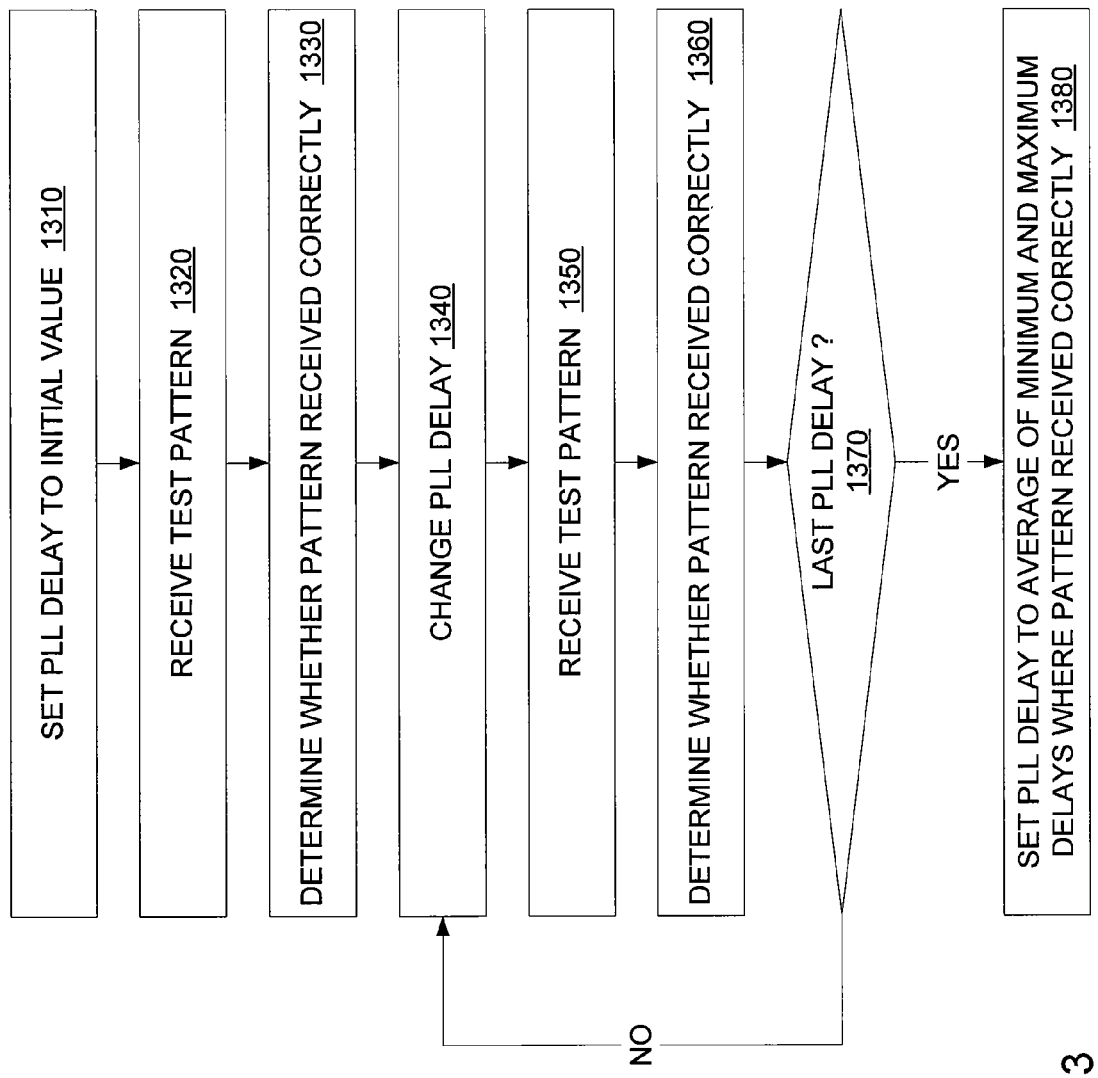
FIG. 13 is a flowchart illustrating a method of adjusting a phase of a leveling clock according to an embodiment of the present invention.

FIG. 13 is a flowchart illustrating a method of adjusting a phase of a leveling clock according to an embodiment of the present invention. In this method, the phase relationship between a leveling clock signal and a synchronization clock signal is adjusted to optimize data reception by a memory interface. In other embodiments of the present invention, the phase of the leveling clock may be adjusted relative to other clock signals.

Specifically, in act 1310, a phase of a clock generated by a phase-locked loop is set to an initial value. In act 1320, a test pattern is received. In act 1330, it is determined whether the pattern was received correctly. In act 1340, the phase of the clock provided by the phase-locked loop is changed. Again, in act 1350, a test pattern is received. It is determined whether this pattern was received correctly in act 1360. In act 1370, it is determined whether the last phase has been tested. If not, the phase of the clock provided by the phase-locked loop is changed again in act 1340. If the last phase has been tested, the phase of the leveling clock provided by the phase-locked loop delay is set to the average of the minimum and maximum delays where the pattern was received correctly in act 1380. In a situation where the delays are incremented or decremented monotonically, the phase-locked loop is set to the average of the first and last delays where the pattern was received correctly.

Figure 14:
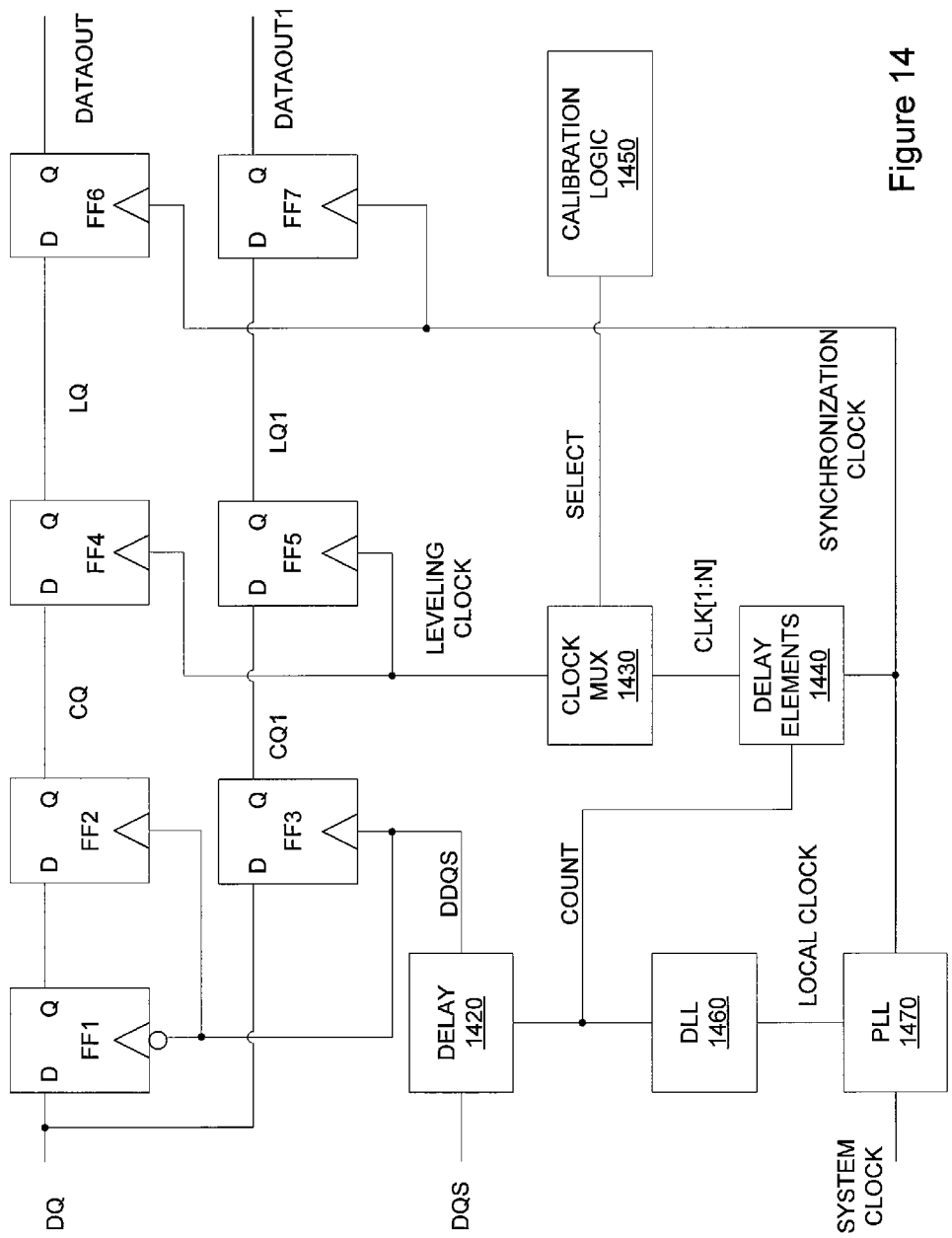
FIG. 14 is a block diagram of a portion of a memory interface circuit according to an embodiment of the present invention.

FIG. 14 is a block diagram of a portion of a memory interface circuit according to an embodiment of the present invention. This figure includes a capture register that is implemented using flip-flops FF1, FF2, FF3, leveling registers implemented as flip-flops FF4 and FF5, synchronization registers FF6 and FF7, delay element 1420, clock multiplexer 1430, delay element 1440, calibration logic 1450, delay-locked loop 1460, and phase-locked loop 1470. The data signal DQ is received by capture register flip-flops FF1 and FF3, which are clocked by alternating edges of the DDQS signal. The output of flip-flop FF1 is retimed by flip-flop FF2, such that the capture register provides outputs CQ and CQ1 on rising edges of the DDQS signal. These output signals are received at rising edges of the leveling clock by leveling element registers FF4 and FF5, which provide outputs LQ and LQ1 on rising edges of the leveling clock. The synchronization registers FF6 and FF7 receive this data on rising edges of the synchronization clock, and in turn provide outputs DATAOUT and DATAOUT1 to other circuitry, such as core circuits (not shown) on an FPGA. The delay element 1420 delays the DQS signal to generate the delayed the delayed DQS signal DDQS. The phase-locked loop 1470 receives a system clock signal from a crystal oscillator or other periodic signal source, generates a local clock, and provides it to the delay-locked loop 1460. The delay-locked loop 1460 provides a control signal COUNT to delay elements 1420 and 1440. The phase-locked loop 1470 also provides the synchronization clock to the synchronization registers FF6 and FF7.

The synchronization clock is delayed by delay elements 1440, which generate a number of clock signals CLK[1:n]. These clock signals are separated in phase from each other, such that the clock multiplexer may select one of a number of clocks having different phases. In a specific embodiment of the present invention, eight clock signals having different phases are provided to the clock multiplexer, one of which is selected and provided as the leveling clock, though in other embodiments of the present invention, other number of clocks may be provided and selected from. These clock signals are multiplexed by the clock multiplexer 1430 to provide the leveling clock signal to the leveling registers FF4 and FF5. The clock multiplexer selection is controlled by calibration logic 1450.

In a specific embodiment of the present invention, a number of clock signals CLK[1:n] are provided to each DQ/DQS group. Each DQ/DQS group includes a clock multiplexer 1430 that selects one of these clocks as the leveling clock for the group. This arrangement limits the number of delay elements 1440 that are needed, but consumes routing resources in delivering clock signals CLK[1:n] to each DQ/DQS group. In other embodiments, the synchronization clock is routed to each DQ/DQS group, each of which has a delay element 1440 and clock multiplexer 1430. These embodiments reduce the consumed routing resources, but require a larger number of delay elements 1440.

Again, the leveling clock should be timed to avoid metastates and instabilities when the leveling element registers FF4 and FF5 receive data from the capture register, and when the synchronization registers FF6 and FF7 receive data from the leveling registers FF4 and FF5. Again, at each signal transfer, the provided data should be provided such that register setup and hold times are not violated. Typically this means that the leveling clock should be adjusted such that its edges are away from edges of the data signals CQ and CQ1, and that the data signals LQ and LQ1, which follow the leveling clock signal by a clock-to-Q delay, should be adjusted such that their edges are away from active edges of the synchronization clock. This adjustment is controlled by selecting one of the clock signals CLK[1:n] using the calibration logic 1450. An example of how this is done is shown in the following figure. Further safeguards can be implemented to aid in data transfer from register to register as well. For example, delay elements can be selectively inserted. Further, negative-edge triggered registers can be selectively inserted in the signal path, where the negative-edge triggered registers are inserted when needed to provide proper set-up and hold times. Also, since the skews caused by the fly-by topology used for the system clock, additional registers can be selectively inserted or removed such that each group of DQ signals received from the memory devices are transferred from the memory controller to the core circuitry on the same clock cycle. These and other circuit techniques that may be incorporated in embodiments of the present invention are illustrated in co-pending co-owned patent application Ser. No. 11/935,347, filed Nov. 5, 2007, titled "I/O BLOCK FOR HIGH PERFORMANCE MEMORY INTERFACES," by Bellis et al., which is incorporated by reference.

Figure 15:
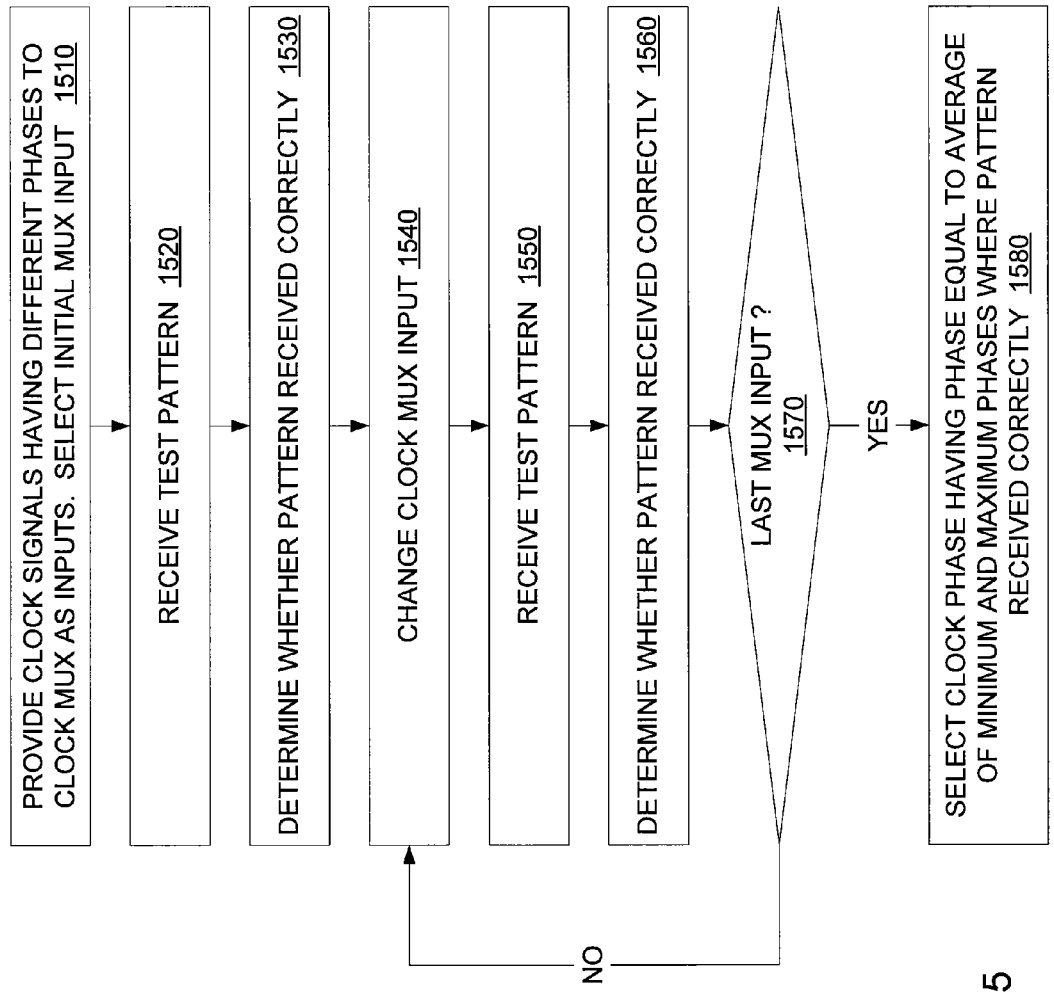
FIG. 15 is a flowchart illustrating the operation of calibration logic employed by an embodiment of the present invention.

FIG. 15 is a flowchart illustrating the operation of the calibration logic employed by an embodiment of the present invention. In this method, a number of clock signals having different phases are provided to a multiplexer. Test pattern data is received using each of these phases as a leveling clock. At each phase, it is determined whether the data is received correctly, and from this, an optimal phase for the leveling clock is determined.

Specifically, in act 1510, a number of clock signals having different phases are provided as inputs to a clock multiplexer. An initial multiplexer input is selected. In act 1520, a test pattern is received, for example, from multipurpose registers 404. In act 1530, it is determined whether the pattern was received correctly. In act 1540, a new clock multiplexer input is selected. Again, the test pattern is received in act 1550, while in act 1560 it is determined whether the pattern was received correctly. In act 1570, it is determined whether the last clock multiplexer input has been checked. If not, a new clock multiplexer input is selected in act 1540.

If the last multiplexer input has been checked in act 1570, then the clock phase having a phase equal to the average of the minimum and maximum phases where the test pattern was received correctly is selected as a leveling clock in act 1580. In various embodiments of the present invention, the clock multiplexer inputs are selected such that the clock phase is monotonically incremented or decremented. In this case, the clock phase having a phase equal to the average of the phases for the first and last clock inputs where test pattern data was received correctly can be used as the leveling clock.

Again, in a typical embodiment of the present invention such as the examples shown here, data from only one data path is checked to determine whether data has been correctly received. For example, in FIG. 14, data at the DATAOUT output is checked, while data at the DATAOUT1 is redundant and is therefore not checked to speed up the calibration routine. In other embodiments of the present invention, only the DATAOUT1 output is checked, while in others, both outputs are checked. Further, in various embodiments of the present invention, data received by each DQ path in a DQ/DQS group is checked in determining whether data was correctly received, that is, data needs to be correctly received by each DQ path to be considered correctly received. In other embodiments, only one DQ path is checked, again to speed up the calibration routine. In other embodiments, these and other techniques may be mixed. For example, an initial calibration may be performed using each DQ path in a DQ/DQS group, while later adjustments are made using only one DQ path.

In the above examples, a delay-locked loop generates a control signal COUNT that is used to control the delay provided by various delay elements. For example, in FIG. 15 a delay-locked loop 1560 generates a COUNT signal that is used by delay element 1420 to generate a phase-shifted DQS signal, and by delay elements 1440 to generate a number of clock signals. An example circuit that may be used is shown in the following figure.

Figure 16:
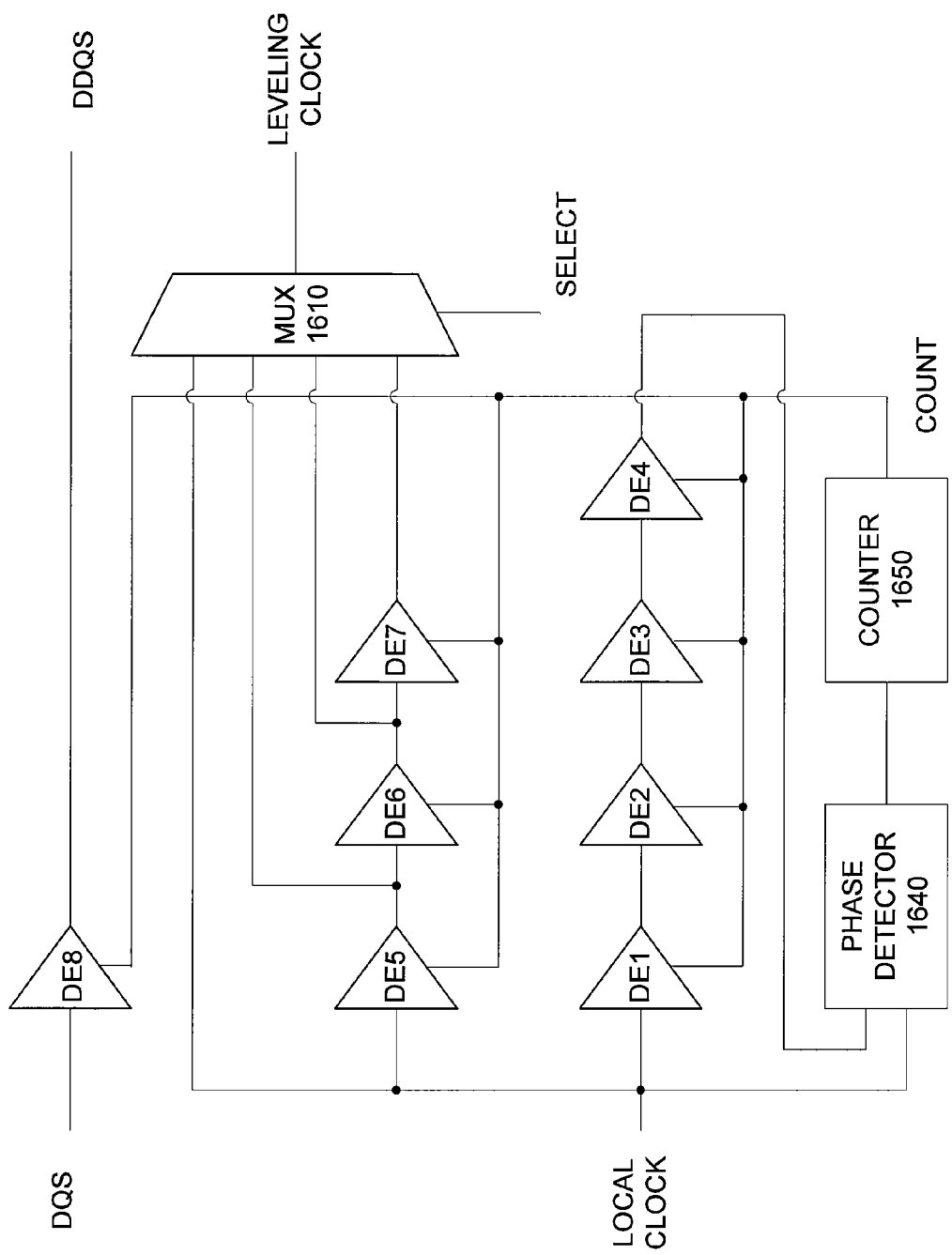
FIG. 16 is a block diagram of a delay-locked loop, a delay element, a number of delay elements, and a clock multiplexer that may be used to implement the delay-locked loop 1460, delay 1420, and delays 1440 in FIG. 14, or in other embodiments of the present invention.

FIG. 16 is a block diagram of a delay-locked loop, a delay element, a number of delay elements, and clock multiplexer that may be used to implement the delay-locked loop 1460, delay 1420, and delays 1440 in FIG. 14 or in other embodiments of the present invention. This figure includes a delay-locked loop made up of delay elements DE1, DE2, DE3, and DE4, phase detector 1640, counter 1650, delay elements DE5, DE6, and DE7, the outputs of which are selected by clock multiplexer 1610 to provide a leveling clock, and delay element DE8, which is used to phase shift the data strobe DQS signal to generate a DDQS signal that clocks the input data capture registers.

In this example, each of the delay elements DE1 through DE8 provide a phase shift that is equal to 90 degrees of the local clock period. In other embodiments of the present invention, other numbers of delay elements can be used, and each delay element may provide a phase shift different than 90 degrees. The local clock is received by delay element DE1 which phase shifts it and provides it to DE2, DE3, and DE4 in succession. The output of this chain is provided to the phase detector 1640, which also receives the local clock signal. The phase detector 1640 provides a signal that either increments or decrements the COUNT provided by counter 1650, which provides the control signal COUNT to the delay elements DE1 through DE4. When the delay-locked loop is locked, the local clock and the output of delay element DE4 are synchronized. At this point, each delay element DE1 through DE4 provides a 90 degree phase shift, for 360 phase shift, or one complete cycle in total. The same COUNT signal is used to adjust the delays provided by delay elements DE5, DE6, and DE7. The local clock and the outputs of the delay elements are multiplexed by clock multiplexer 1610 under control of the select signals provided by the calibration logic (not shown). The output of multiplexer 1610 is provided as a leveling clock to leveling registers (not shown). The same COUNT signal is also provided to delay element DE8, such that delay element provides a 90 degree phase shift to the DQS signal in order to generate DDQS.

This figure includes four delay elements DE1, DE2, DE3, and DE4 in the delay-locked loop. In other embodiments, other numbers of delay elements may be used. Typically, the delay elements phase shift the clock signal by 360 degrees, or one clock cycle. However, the output of the delay line may be inverted, in which case the delay elements phase shift the clock cycle by 180 degrees, with an additional 180 degrees phase-shift being accomplished by the signal inversion. Where four delay elements are used to delay the clock one cycle, each delay element phase shifts the clock signal 90 degrees. Where "N" delay elements are used, each delay element phase shifts the clock signal by 360/N, or 180/N if a signal inversion is used. Also, for simplicity, only one delay element DE8 is used to delay the DQS signal. In practical circuits, more delay elements may be used to provide greater flexibility to a user. Further, each delay element may be made up of a number of sub-elements where the number of sub-elements may be varied to provide even further flexibility. For example, one or more such sub-elements may be bypassed using a selection or multiplexer circuit.

Figure 17:
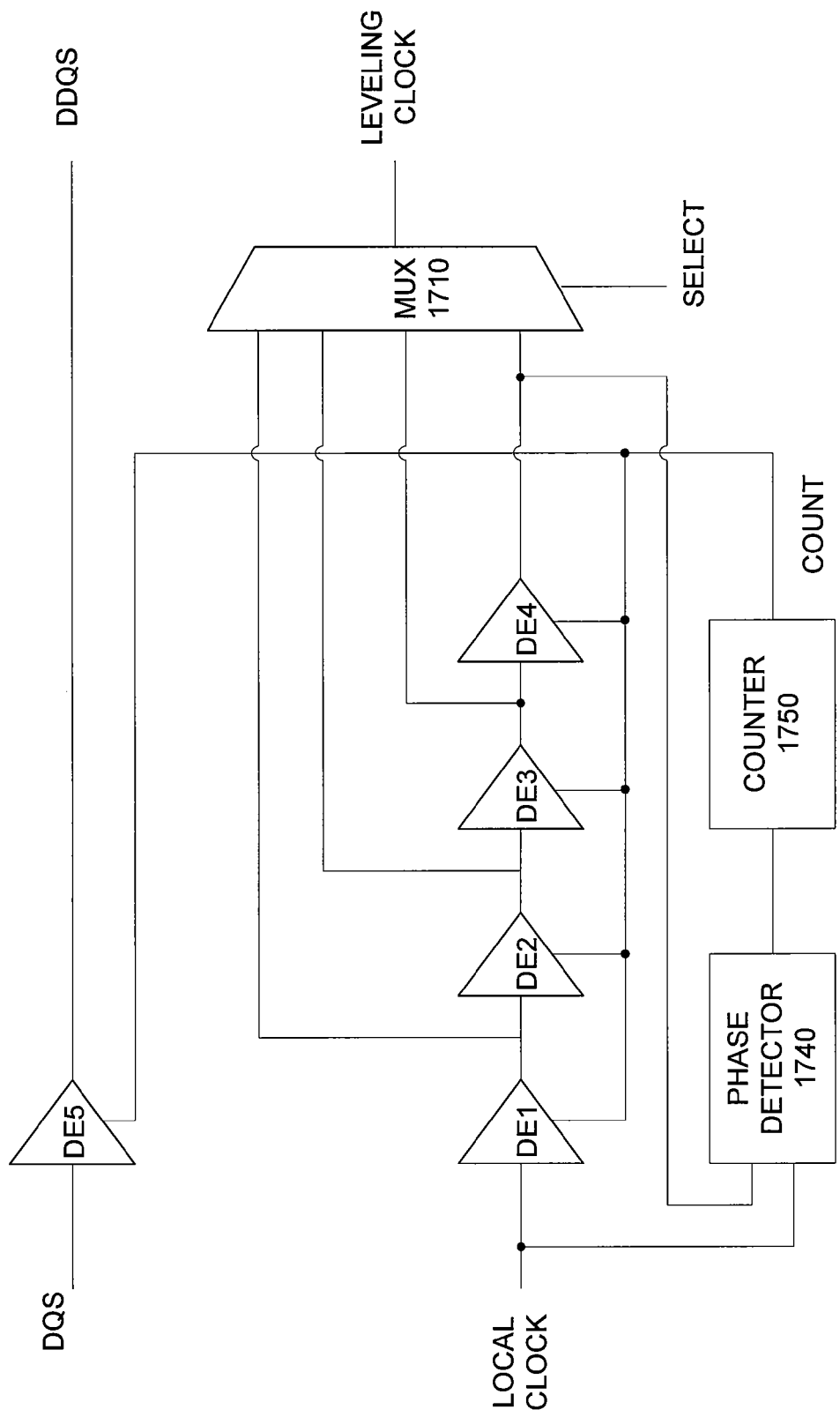
FIG. 17 illustrates one possible simplification of the circuitry of FIG. 16.

FIG. 17 illustrates a possible simplification of the circuitry of FIG. 16 that may be desirable in some embodiments of the present invention. In FIG. 16, it can be seen that the function of delay elements DE1, DE2, and DE3 are repeated by delay elements DE5, DE6, and DE7. Accordingly, this circuitry may be simplified as shown in FIG. 17, in some embodiments of the present invention. For example, in one embodiment of the present invention, delay elements DE5, DE6, and DE7 are placed in the memory interface once, and their outputs are routed to a clock multiplexer located in each DQ/DQS group, while the delay elements DE1, DE2, and DE3 are also placed once in the memory interface. In this embodiment, it may be desirable to merge the function of the delay elements DE1, DE2, and DE3 with the function of delay elements DE5, DE6, and DE7. In other embodiments of the present invention, due to layout proximity or other reasons, such a simplification may be undesirable. For example, in one embodiment of the present invention, delay elements DE5, DE6, and DE7 are repeated once and positioned, along with a clock multiplexer, near each DQ/DQS group, while the delay elements DE1, DE2, and DE3 are implemented only once for the memory interface.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of receiving data comprising:
  receiving a plurality of strobe signals;
  receiving a plurality of groups of data signals, where each group of data signals is associated with a strobe signal;
  for each group of data signals:
    retiming each data signal in the group using the associated strobe signal to generate a group of first retimed data signals; and
    phase shifting each of the first retimed data signals to generate a group of second retimed data signals, wherein the first retimed data signals in the group are phase shifted an amount that is calibrated to reduce data reception errors; and retiming a plurality of groups of second retimed signals using a first clock signal.

2. The method of claim 1 wherein each first retimed signal is phase shifted using a delay element.

3. The method of claim 1 further comprising:
before retiming each data signal in the group, phase-shifting the associated strobe signal.

4. The method of claim 3 wherein phase-shifting the strobe signal comprises phase-shifting the associated strobe signal approximately 90 degrees.

5. The method of claim 3 wherein retiming each data signal in the group using the associated strobe signal comprises receiving each data signal using a double data rate register clocked by the associated strobe signal.

6. The method of claim 3 where the amount is calibrated by:
incrementing the amount from a first value to a second value;
at each increment, receiving a known data pattern and determining whether each data signal in the group is received correctly; and
using each determination of whether data was received correctly to set the amount.

7. An integrated circuit comprising:
a plurality of groups of input cells, each group of input cells comprising:
a strobe signal input buffer;
a group of data input buffers;
a group of input registers, each coupled to receive an output from one of the group of data input buffers;
a group of delay elements, each coupled to receive an output from one of the group of input registers, where the delay elements provide a first delay such that data is correctly received by the group of input cells; and
a group of output registers, each coupled to receive an output from one of the group of delay elements,
wherein each input register comprises:
a first flip-flop coupled to an output of a data input buffer;
a second flip-flop coupled to the output of the data input buffer; and
a third flip-flop coupled to an output of the first flip-flop.

8. The integrated circuit of claim 7 wherein the groups of output registers in the plurality of groups of input cells are clocked by a first clock signal.

9. The integrated circuit of claim 8 wherein the first clock signal is generated using a phase-locked loop.

10. The integrated circuit of claim 7 further comprising:
a phase-shift circuit coupled to an output of the strobe signal input buffer, wherein the phase-shift circuit phase shifts a strobe signal received at the strobe signal input buffer by approximately 90 degrees.

11. The integrated circuit of claim 7 further comprising a delay-locked loop that provides a count, where the count is adjusted to set the first delay through the group of delay elements.

12. A method of receiving data comprising:
receiving a plurality of strobe signals;
receiving a plurality of groups of data signals, where each group of data signals is associated with a strobe signal;
for each group of data signals:
retiming each data signal in the group using the associated strobe signal to generate a group of first retimed data signals;
receiving a plurality of clock signals;
selecting a first clock in the plurality of clock signals; and
retiming each first retimed data signal in the group using the first clock signal to generate a group of second retimed data signals, wherein the first clock signal is selected to reduce data reception errors; and
retiming a plurality of groups of second retimed data signals using a second clock signal.

13. The method of claim 12 wherein each first retimed signal is retimed using a flip-flop.

14. The method of claim 12 further comprising:
before retiming each data signal in the group, phase-shifting the associated strobe signal.

15. The method of claim 14 wherein phase-shifting the strobe signal comprises phase-shifting the associated strobe signal approximately 90 degrees.

16. The method of claim 14 wherein retiming each data signal in the group using the associated strobe signal comprises receiving each data signal using a double data rate register clocked by the associated strobe signal.

17. The method of claim 14 where the amount is calibrated by:
selecting each of the plurality of clock signals;
for each selected clock signal, receiving a known data pattern and determining whether each data signal in the group is received correctly; and
using each determination of whether data was received correctly to select the first clock signal.

18. An integrated circuit comprising:
a plurality of groups of input cells, each group of input cells comprising:
a strobe signal input buffer;
a group of data input buffers;
a group of input registers, each coupled to receive an output from one of the group of data input buffers;
a group of resynchronization registers, each coupled to receive an output from one of the group of input registers;
a clock multiplexer coupled to receive a plurality of clock signals and to provide a first clock signal to the group of resynchronization registers, where the first clock signal is selected such that data is correctly received by the group of input cells; and
a group of output registers, each coupled to receive an output from one of the group of delay elements.

19. The integrated circuit of claim 18 wherein the groups of output registers in the plurality of groups of input cells are clocked by a second clock signal.

20. The integrated circuit of claim 18 wherein the plurality of clock signals are generated using a plurality of delay elements.

21. The integrated circuit of claim 18 wherein each input register comprises:
a first flip-flop coupled to an output of a data input buffer;
a second flip-flop coupled to the output of the data input buffer; and
a third flip-flop coupled to an output of the first flip-flop.

22. The integrated circuit of claim 18 further comprising:
a phase-shift circuit coupled to an output of the strobe signal input buffer, wherein the phase-shift circuit phase shifts a strobe signal received at the strobe signal input buffer by approximately 90 degrees.

* * * * *